(12) United States Patent
Cha et al.

(10) Patent No.: US 12,171,073 B2
(45) Date of Patent: Dec. 17, 2024

(54) DISPLAY APPARATUS

(71) Applicant: LG DISPLAY CO., LTD., Seoul (KR)

(72) Inventors: Sang-Hyup Cha, Paju-si (KR); Dong-Young Suh, Paju-si (KR); Ho-Kyung Yu, Paju-si (KR); Sung-Ho Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 196 days.

(21) Appl. No.: 17/973,238

(22) Filed: Oct. 25, 2022

(65) Prior Publication Data

US 2023/0217606 A1 Jul. 6, 2023

(30) Foreign Application Priority Data

Dec. 31, 2021 (KR) .................. 10-2021-0194628

(51) Int. Cl.
*H02H 9/00* (2006.01)
*F03G 7/06* (2006.01)
*G02F 1/1333* (2006.01)
*H05K 5/02* (2006.01)
*H05K 9/00* (2006.01)
*H10K 50/86* (2023.01)
*H10K 59/126* (2023.01)
*H10K 59/65* (2023.01)
*G02F 1/1335* (2006.01)

(52) U.S. Cl.
CPC ......... *H05K 5/0214* (2022.08); *F03G 7/0614* (2021.08); *G02F 1/133308* (2013.01); *H05K 9/0067* (2013.01); *H10K 50/86* (2023.02); *H10K 59/126* (2023.02); *H10K 59/65* (2023.02); *G02F 1/133528* (2013.01); *G02F 2202/22* (2013.01)

(58) Field of Classification Search
None
See application file for complete search history.

(56) References Cited

U.S. PATENT DOCUMENTS

| | | | |
|---|---|---|---|
| 9,204,565 B1* | 12/2015 | Lee | .......................... E05D 7/00 |
| 2018/0054553 A1* | 2/2018 | Choi | ....................... H04N 23/90 |
| 2022/0271263 A1* | 8/2022 | Li | ......................... H10K 50/868 |
| 2023/0109163 A1* | 4/2023 | Kim | ..................... H10K 50/868 257/40 |

FOREIGN PATENT DOCUMENTS

| | | |
|---|---|---|
| KR | 10-2016-0134417 A | 11/2016 |
| KR | 10-2018-0111281 A | 10/2018 |
| KR | 10-2020-0044442 A | 4/2020 |
| KR | 10-2020-0073549 A | 6/2020 |
| KR | 10-2020-0075547 A | 6/2020 |
| KR | 10-2021-0055954 A | 5/2021 |
| KR | 10-2021-0085239 A | 7/2021 |

* cited by examiner

*Primary Examiner* — Stephen W Jackson
(74) *Attorney, Agent, or Firm* — POLSINELLI PC

(57) ABSTRACT

A display apparatus includes a display panel including a display area, in which a plurality of sub-pixels are disposed, and a sensor area at the display area, a first hole at in the sensor area; a first member disposed on a front surface of the display panel; a second member disposed at a rear surface of the display panel and including the first hole; a third member disposed at a rear surface of the second member and including a second hole overlapping the first hole; and a fourth member covering an inner surface of the first hole and a portion of the second member exposed through the second hole.

14 Claims, 6 Drawing Sheets

DISPLAY APPARATUS

CROSS-REFERENCE TO RELATED APPLICATION

The present application claims the priority of Korean Patent Application No. 10-2021-0194628 filed on Dec. 31, 2021, which is hereby incorporated by reference in its entirety.

BACKGROUND

Field of the Disclosure

The present disclosure relates to a display apparatus.

Description of the Background

As the information society develops, the demand for a display device that displays an image is increasing, and various types of display devices such as a liquid crystal display device and an organic light emitting display device are utilized.

The display device, which is used for the computer monitor, the TV, the mobile phone, and the like, includes an organic light emitting display (OLED) being a self-emission type and a liquid crystal display (LCD) that requires a separate light source.

The display device has a wide range of application to the personal portable device as well as the computer monitors and the TV, and research on the display device having a reduced volume and weight with a large display area is in progress.

In addition, the display device includes an optical component such as a camera and a proximity sensor in order to provide more various functions to the user. However, since the optical component, e.g., the camera, must be exposed to the outside in order to recognize light, the display device, in which a part is cut in a notch shape or a hole is formed to arrange the optical component, is being developed.

SUMMARY

The present disclosure is directed to a display apparatus that substantially obviates one or more of the problems associated with the limitations and disadvantages of the conventional art.

More specifically, the present disclosure is to provide a display apparatus being capable of preventing a noise in an optical component by light emitted from a sub-pixel.

The present disclosure is also to provide a display device being capable of preventing a reliability decrease of an optical component by a static electricity.

Further, the present disclosure is to provide a display device being capable of reducing the production cost.

Additional features and advantages of the present disclosure are set forth in the description which follows, and will be apparent from the description, or evident by practice of the present disclosure. Other advantages of the present disclosure are realized and attained by the features described herein as well as in the appended drawings.

To achieve these and other advantages in accordance with the purpose of the aspects of the present disclosure, as described herein, an aspect of the present disclosure is a display apparatus comprising a display panel including a display area, in which a plurality of sub-pixels are disposed, and a sensor area at the display area, a first hole disposed in the sensor area; a first member disposed on a front surface of the display panel; a second member disposed at a rear surface of the display panel and including the first hole; a third member disposed at a rear surface of the second member and including a second hole overlapping the first hole; and a fourth member covering an inner surface of the first hole and a portion of the second member exposed through the second hole.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate aspects of the present disclosure and together with the description serve to explain the principles of the present disclosure.

In the drawings.

Figure 1:
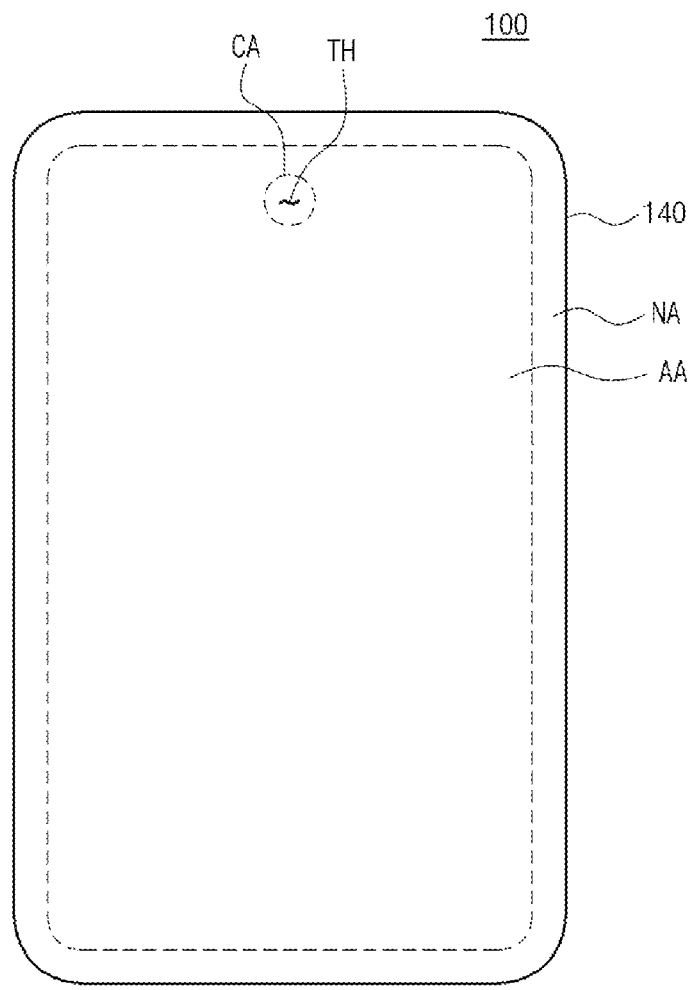
FIG. 1 is a schematic plan view of a display apparatus according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the disclosure to the skilled in the art of the present disclosure, and the present disclosure is only defined by the scope of the claims.

The shapes, sizes, proportions, angles, numbers, and the like disclosed in the drawings for explaining the aspects of the present disclosure are illustrative, and the present disclosure is not limited to the illustrated matters. The same reference numerals refer to the same elements throughout the specification. In addition, in describing the present disclosure, if it is determined that a detailed description of the related known technology unnecessarily obscure the subject matter of the present disclosure, the detailed description thereof can be omitted. When 'including', 'having', 'consisting', and the like are used in this specification, other parts may be added unless 'only' is used. When a component is expressed in the singular, cases including the plural are included unless specific statement is described.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

In the present disclosure, "display device" may include a liquid crystal module (LCM), an organic light emitting module (OLED Module), and a quantum dot module including a display panel and a driving unit for driving the display panel. In addition, "display device" may include a complete product or final product including LCM, OLED module, QD module, such as a notebook computer, a television, a computer monitor, an equipment display apparatus, e.g., an automotive display apparatus or other form of a vehicle, a mobile electronic apparatus, e.g., a smart phone or an electronic pad. These final products may be referred to as a set device or a set apparatus.

Accordingly, the display device in the present disclosure may include the display device in a narrow definition, such as LCM, OLED module, QD module, or the like, and the set device, which is an application product or end-user device including LCM, OLED module, QD module, or the like.

In some cases, LCM, OLED module and QD module including the display panel and the driving unit may be referred to as "display device" in a narrow definition, and electronic device as a final product including LCM, OLED module, and QD module may be referred to as a "set device". For example, the display device in the narrow definition may include the display panel and a source PCB as a control unit for driving the display panel, and the set device may further include a set PCB as a set control unit being connected to the source PCB and controlling the entire set device.

The display panel used in the present disclosure includes all type of display panels, e.g., a liquid crystal display panel, an organic light emitting diode (OLED) display panel, a quantum dot (QD) display panel, an electroluminescent display panel. The display device may include the OLED display panel including a flexible substrate and a back plate under the flexible substrate and may have a bezel-bending structure. However, aspects of the present disclosure are not limited thereto. In addition, it is not limited to the shape or size of the display panel used in the display device according to the aspect of the present disclosure.

For example, an OLED display panel may include a plurality of gate lines and data lines, and pixels formed at intersections of the gate lines and the data lines. In addition, the OLED display panel may include an array including a thin film transistor, which is an element for selectively applying a voltage to each pixel, an organic light emitting device layer on the array, and an encapsulation substrate (e.g., an encapsulation layer) disposed over the array to cover the organic light emitting device layer. The encapsulation layer may protect the thin film transistor and the organic light emitting device layer from external impact, and may prevent penetration of moisture or oxygen into the organic light emitting device layer. In addition, the layer formed on the array may include an inorganic light emitting layer, e.g., a nano-sized material layer or quantum dots.

Reference will now be made in detail to some of the examples and various aspects, which are illustrated in the accompanying drawings.

Figure 2:
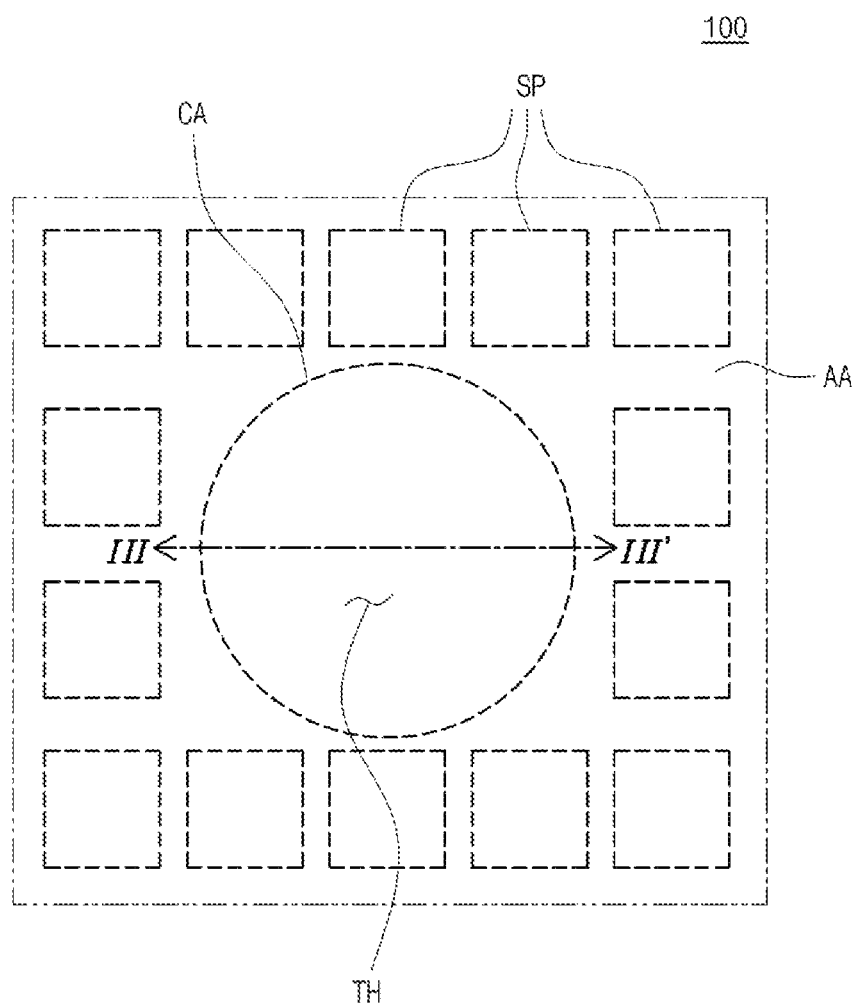
FIG. 2 is an enlarged-plan view of a portion of a display apparatus according to an aspect of the present disclosure.

FIG. 1 is a schematic plan view of a display apparatus according to an aspect of the present disclosure, and FIG. 2 is an enlarged-plan view of a portion of a display apparatus according to an aspect of the present disclosure.

With reference to FIGS. 1 and 2, a display panel 140 of a display apparatus, e.g., a display device, 100 is a panel providing an image and includes a display element, and a circuit a line and a component driving the display element. A display area AA, a non-display area NA and a camera area (e.g., a sensor area) CA are defined on the display panel 140.

The display area AA includes a plurality of sub-pixels SP to display an image. Each of the sub-pixels SP is a separating unit emitting light, and a light emitting element and a driving circuit may be formed in each of the sub-pixels SP. For examples, a display element for displaying an image and a circuit part for driving the display element may be formed in each of the sub-pixels SP. In an organic light emitting display device as the display apparatus 100, the display element may be a light emitting element, e.g., an organic light emitting diode. In a liquid crystal display device as the display apparatus 100, the display element may be a liquid crystal element, e.g., a liquid crystal capacitor. The plurality of sub-pixels SP may include a red sub-pixel, a green sub-pixel and a blue sub-pixel with or without additional white sub-pixel, but aspects of the present disclosure are not limited thereto.

The non-display area NA is an area where the image is not displayed. For example, various lines and a driving IC for driving the plurality of sub-pixels SP in the display area AA may be disposed in the non-display area NA. For example, various ICs and driving circuits such as a gate driver IC and a data driver IC may be disposed in the non-display area NA, but aspects of the present disclosure are not limited thereto. The non-display area NA, where an image is not displayed, may also be defined as a bezel area.

The non-display area NA may be set as an area surrounding the display area AA as shown in FIG. 1. For example, the non-display area NA may be set as an area extending from the display area AA or may be set as an area where the plurality of sub-pixels SP are not disposed, but aspects of the present disclosure are not limited thereto.

A camera area, e.g., a sensor area, CA may be disposed inside the display area AA. The camera area CA may be disposed between the plurality of sub-pixels SP in the display area AA.

The camera area CA may be an area in which an optical component, such as a camera or a proximity sensor, is disposed. The camera area CA may include a through-hole TH penetrating through some components of the display apparatus 100 in order to place the optical component. A space for the optical component may be secured by forming the through-hole TH penetrating the display panel 140.

The light emitted from the plurality of sub-pixels SP may travel toward the camera area CA disposed between the plurality of sub-pixels SP, e.g., the through-hole TH. When the light from the plurality of sub-pixels SP is transmitted to the optical component, e.g., a camera, in the through-hole TH, noise may be generated and reliability of the optical component may be deteriorated. In the display apparatus 100 of the present disclosure, in order to block the light from the sub-pixel SP into the through-hole TH, a fourth member 170 (of FIG. 3) may be disposed in the through-hole TH. The fourth member 170 may be a conductive light blocking member, a light blocking film, or a shield, but aspects of the present disclosure are not limited thereto.

Figure 3:
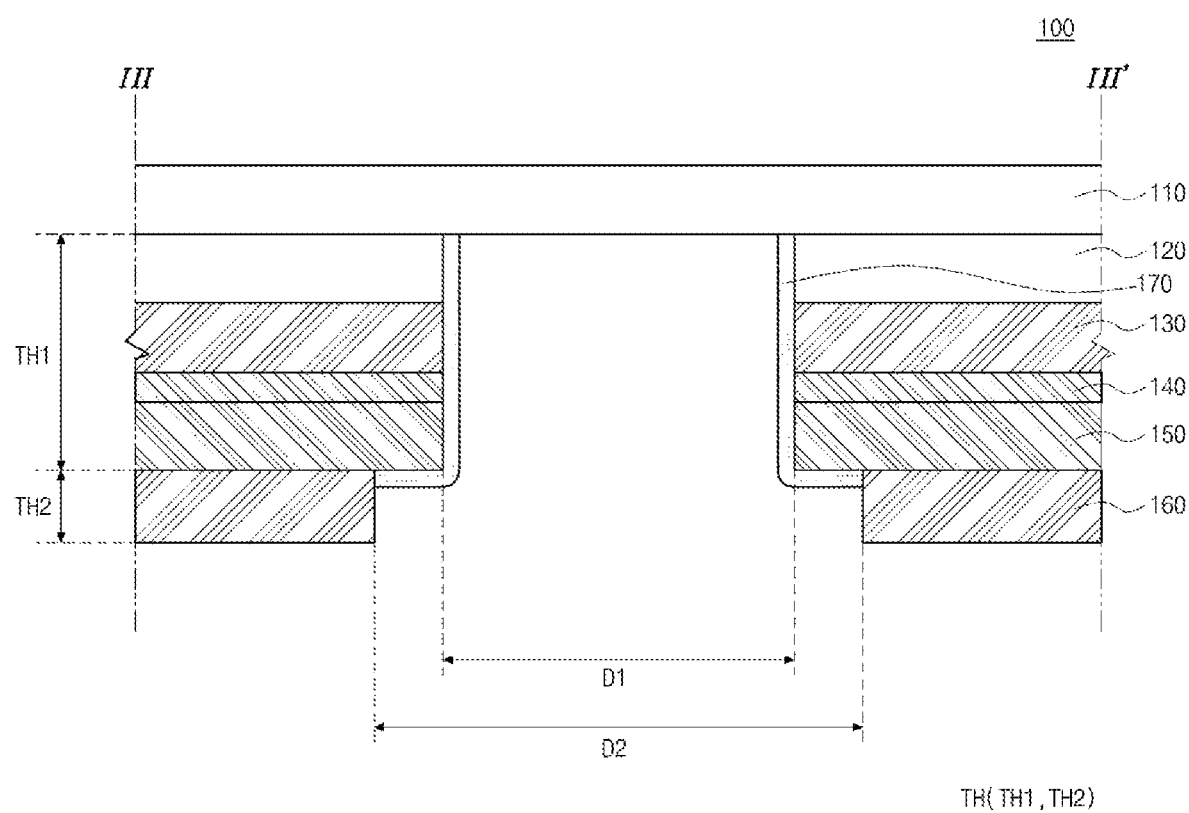
FIG. 3 is a cross-sectional view taken along line III-III in FIG. 2.

FIG. 3 is a cross-sectional view taken along the line III-III' in FIG. 2.

With reference to FIG. 3, the display apparatus 100 according to the aspect of the present disclosure includes a first member 110, an adhesive layer 120, a polarizing plate 130, a display panel 140, and a second member 150, and a third member 160.

The first member 110 may be disposed on the display panel 140. The first member 110 may protect the polarizing plate 130 and the display panel 140 under the first member 110 from external impact, moisture, heat, and the like. The first member 110 may be made of a material having impact resistance and light transmittance. For example, the first member 110 may be a substrate made of glass, or a plastic film made of a plastic material such as polymethylmethacrylate (PMMA), polyimide (PI), and polyethylene terephthalate (PET). The first member 110 may be a cover window, a front member, or a cover glass, but aspects of the present disclosure are not limited thereto. The first member 110 is disposed over an image-displaying side, e.g., a front surface, of the display panel 140.

The polarizing plate 130 may be disposed between the first member 110 and the display panel 140. The polarizing plate 130 selectively transmits light to reduce reflection of external light incident on the display panel 140. For example, the display panel 140 includes various metal materials applied to the thin film transistor, the lines (e.g., wirings), the light emitting elements, and the like. Accordingly, the external light incident on the display panel 140 may be reflected by the metal material, and the visibility of the display apparatus 100 may be reduced due to the reflection of the external light. In the display apparatus 100 of the present disclosure, by disposing the polarizing plate 130 on one surface of the display panel 140, the reflection of the external light may be prevented, and outdoor visibility of the display apparatus 100 may be improved.

The adhesive layer 120 may be formed between the polarizing plate 130 and the first member 110 and the first member 110 may be adhered and disposed on the polarizing plate 130. The adhesive layer 120 may be made of a material having adhesive properties. For example, the adhesive layer 120 may be formed of an optical clear adhesive (OCA), a pressure sensitive adhesive (PSA), or the like, but aspects of the present disclosure are not limited thereto.

The second member 150 may be disposed under the display panel 140. When the substrate constituting the display panel 140 is made of a plastic material such as polyimide, a support substrate made of glass is disposed under the substrate to perform a manufacturing process of the display apparatus 100. In the end of the manufacturing process of the display apparatus, the support substrate may be released. After the support substrate is released, a component for supporting the substrate is required, the second member 150 for supporting the substrate may be disposed under the substrate of the display panel 140. The second member 150 may support the display panel 140 and protect the display panel 140 from external moisture, heat, impact, and the like. The second member 150 may be a film made of polyimide (PI), polyethylene terephthalate (PET), or polyethylene naphthalate (PEN), but aspects of the present disclosure are not limited thereto. The second member 150 may be a back plate, a first plate, or a support substrate, but aspects of the present disclosure are not limited thereto.

The third member 160 may be disposed under the second member 150. The third member 160 may protect and support a structure on the third member 160. Since the third member 160 is made of a rigid material, the occurrence of the defect, e.g., dent marks, due to an external impact can be minimized. In addition, the third member 160 may function as a heat dissipation (or radiation) member emitting heat generated when the display apparatus 100 is driven. The third member 160 may be made of a material having excellent electrical conductivity and may discharge static electricity generated in the first member 110 to the outside, together with the fourth member 170. The third member 160 may be made of a material having excellent thermal and electrical conductivity. For example, the third member 160 may be made of copper (Cu) or graphite, but aspects of the present disclosure are not limited thereto. The third member 160 may be a metal plate, a second plate, or a rigid member, but aspects of the present disclosure are not limited thereto.

The through-hole TH may be formed in the remaining elements of the display apparatus 100 except for the first member 110. The through-hole TH may be formed through the adhesive layer 120, the polarizing plate 130, the display panel 140, the second member 150, and the third member 160. The through-hole TH may be a space for arranging the optical component, e.g., a camera, in the display area AA. The optical component may be disposed in the through-hole TH to recognize an external environment outside the first member 110. The optical component may operate by recognizing external light transmitted to the optical component through the first member 110. Since the through-hole TH is not formed in the first member 110, the penetration of foreign substances into the through-hole TH can be prevented.

The size of the through-hole TH in the third member 160 may be adjusted according to the order of the process of attaching the third member 160 and the process of forming the through-hole TH. Hereinafter, for convenience of description, the through-hole continuously formed in the adhesive layer 120, the polarizing plate 130, the display panel 140, and the second member 150, for example, disposed along the adhesive layer 120, the polarizing plate 130, the display panel 140, and the second member 150, is referred to as a first hole (or first through-hole) TH1, and the through-hole formed in the third member 160 is referred to as a second hole (or second through-hole) TH2.

With reference to FIG. 3, after the first hole TH1 having a first diameter D1 is formed in the adhesive layer 120, the polarizing plate 130, the display panel 140, and the second member 150, the third member 160, in which the second hole TH2 having the second diameter D2 is formed, may be attached to the rear surface of the second member 150. For example, the first diameter D1 of the first hole TH1 may be smaller than the second diameter D2 of the second hole TH2. When the second hole TH2 is smaller than the first hole TH1, it may be difficult to align the second hole TH2 and the first hole TH1 when the third member 160 is attached or form the fourth member 170 in the first hole TH1. Accordingly, when the through-hole TH is formed before the third member 160 is attached, the laminated structure of the adhesive layer 120, the polarizing plate 130, the display panel 140, and the second member 150, where the first hole TH1 is formed, and the third member 160 having the second hole TH2, which has a diameter greater than the first hole TH1, may be attached to manufacture the display apparatus 100.

In another example, the through-hole TH may be formed after the adhesive layer 120, the polarizing plate 130, the display panel 140, the second member 150 and the third member 160 are attached. In this instance, the diameter of the first hole TH1, which is formed in the adhesive layer 120, the polarizing plate 130, the display panel 140, and the second member 150, and the diameter of the second hole TH2, which is formed in the third member 160, may be same. The size of the through-holes TH formed in the adhesive layer 120, the polarizing plate 130, the display panel 140, the second member 150 and the third member 160 may vary, and aspects of the present disclosure are not limited thereto.

The fourth member 170 is disposed inside the through-hole TH. The fourth member 170 may be made of an opaque and/or electrically conductive material and may be a conductive light blocking member, a light blocking film, or a shield. However, aspects of the present disclosure are not limited thereto. The fourth member 170 may block light of the display panel 140 from entering the through-hole TH and discharge static electricity generated by the first member 110. The fourth member 170 may cover a portion of a rear surface of the first member 110, a side surface of the adhesive layer 120, a side surface of the polarizing plate 130, a side surface of the display panel 140, a side surface of the second member 150 and a portion of a side surface of the third member 160 exposed in the through-hole TH. The fourth member 170 may be disposed to cover the inner surface of the through-hole TH and a portion of the rear surface of the first member 110 corresponding to the circumference of the through-hole TH. One end (or one side) of the fourth member 170 may be disposed on the first member 110, and the other end (or the other side) of the fourth member 170 may be in contact with the third member 160. The fourth member 170 may overlap a portion of the third member 160.

For example, the fourth member 170 may cover portions of the first member 110, the adhesive layer 120, the polarizing plate 130, the display panel 140 and the second member 150 exposed through the first hole TH1. Namely, the fourth member 170 may cover a portion of the rear surface of the first member 110, a boundary portion between the rear surface of the first member 110 and the side surface of the adhesive layer 120, a side surface of the adhesive layer 120, a side surface of the polarizing plate 130, a side surface of the display panel 140, and a side surface of the second member 150. The fourth member 170 may cover portions of the second member 150 and the third member 160 exposed through the second hole TH2. For example, the fourth member 170 may cover a portion of the rear surface of the second member 150 and a boundary portion between the rear surface of the second member 150 and the side surface of the third member 160, and a portion of a side surface of the fourth member 170. For example, when the diameter of the second hole TH2 of the third member 160 is greater than that of the first hole TH1 of the adhesive layer 120, the polarizer 130, the display panel 140 and the second member 150, the fourth member 170 may cover a portion of the second member 150 exposed in the second hole TH2 as well as a portion of the third member 160.

The fourth member 170 may cover only a portion of the side surface of the third member 160, and may not cover the remaining portion of the side surface of the third member 160 and the rear surface of the third member 160. The end of the fourth member 170 may not be disposed outside the through-hole TH, but may be disposed only inside the through-hole TH. When the fourth member 170 is disposed to cover the rear surface of the third member 160, other structures on the third member 160 and the fourth member 170 may interfere or an electrical short may occur. For example, when a circuit board for driving an optical component is disposed on the rear surface of the third member 160, the fourth member 170 extending to the rear surface of the third member 160 and the circuit board on the rear surface of the third member 160 interfere with each other to cause a short circuit. In addition, when a structure such as a frame is attached to the rear surface of the third member 160, interference with the fourth member 170 may occur.

The fourth member 170 may be made of an opaque and electrically conductive material. Accordingly, the light leakage into the through-hole TH from the sub-pixel SP can be prevented by the fourth member 170, and the static electricity can be discharged by the fourth member 170. The fourth member 170 may be made of a conductive ink or a conductive paste. For example, the conductive ink may include a conductive particle, such as carbon black, or a conductive polymer, such as PEDOT:PSS (poly(3,4-ethylenedioxythiophene)), and the conductive paste may include silver. However, aspects of the present disclosure are not limited thereto. In addition, the fourth member 170 may have a resistance of 0 to $10^6$ Ω (ohm) to discharge the static electricity, but aspects of the present disclosure are not limited thereto. The fourth member 170 may be formed of a material being capable of absorbing the light. When the fourth member 170 is formed of a reflective material, the light leakage from the sub-pixel SP toward the through-hole TH is reflected by the fourth member 170 toward the sub-pixels SP so that the color mixing in the sub-pixels SP may be generated. Accordingly, the fourth member 170 may include a material, e.g., carbon black, being capable of absorbing the light.

The fourth member 170 may be formed of a moisture-proof material. In the display apparatus 100 according to the aspect of the present disclosure, the camera area CA is disposed inside the display area AA. The camera area CA includes a through-hole TH penetrating through some components of the display apparatus 100 in order to place the optical component. A space, in which the optical component is disposed, may be secured by forming the through-hole TH penetrating the display panel 140. Moisture penetrating into the space inside the through-hole TH can be transferred to the adhesive layer 120, the polarizing plate 130, the display panel 140, and/or the second member 150 disposed along the through-hole TH so that the performance of the above elements may be affected by the moisture. The fourth member 170 is made of the moisture-proof material and covers a side surface of each of the adhesive layer 120, the polarizing plate 130, the display panel 140 and the second member 150 exposed in the through-hole TH. Accordingly, moisture penetration into the adhesive layer 120, the polarizing plate 130, the display panel 140, and/or the second member 150 can be prevented by the fourth member 170. Namely, the fourth member 170 may have a light blocking property, an electrically conductive property and/or a moisture-proof property.

Figure 4:
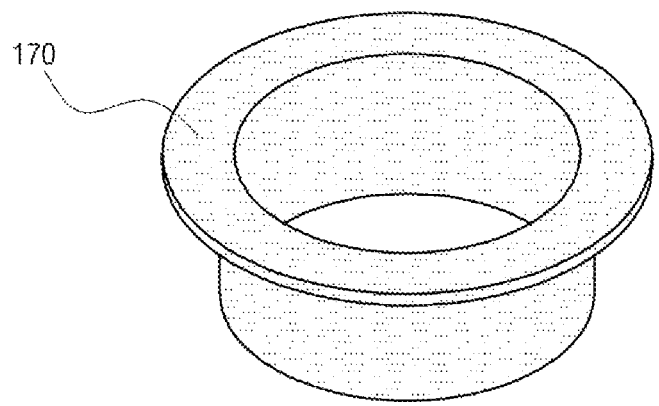
FIG. 4 is a perspective view of a fourth member in a display apparatus according to an aspect of the present disclosure.

FIG. 4 is a perspective view of a fourth member in a display apparatus according to an aspect of the present disclosure.

With reference to FIG. 4, the fourth member 170 may have a pipe-shaped structure having a flange portion at one end. The fourth member 170 can cover a portion of a rear surface of the first member 110, a side surface of the adhesive layer 120, a side surface of the polarizing plate 130, a side surface of the display panel 140, a side surface of the second member 150 and a portion of a side surface of the third member 160, which are exposed through the through-hole TH. The fourth member 170 may cover the portion of the side surface of the third member 160 and may not cover the remaining portion of the side surface of the third member 160 and the rear surface of the third member 160. For example, a first height from the fourth member 170 to the first member 110 may be greater than a second height from the second member 150 to the first member 110 and smaller than a third height from the third member 160 to the first member 110.

A shape, e.g., a first shape, of a portion of the fourth member 170 covering the portion of the rear surface of the first member 110, the side surface of the adhesive layer 120, the side surface of the polarizing plate 130, the side surface of the display panel 140 and the side surface of the second member 150 may be a pipe shape. A shape, e.g., a second shape, of a portion of the fourth member 170 covering the portion of the rear surface of the second member 150 and the portion of the side surface of the third member 160 may be a ring shape. Accordingly, the fourth member 170 may have the pipe-shaped structure having the flange portion at one end by combining the first shape and the second shape.

The fourth member 170 may be made of a material having a shape memory property. For example, the pipe-shaped fourth member 170 having the flange portion at one end may be formed of a material having the shape memory property. The material having the shape memory property may be a shape memory polymer, but aspects of the present disclosure are not limited thereto. The shape memory polymer can have the property of memorizing the initial body shape due to its thermal/mechanical properties. The shape memory polymer becomes flexible and restores into the initial body shape in a condition over the transition temperature, while the shape memory polymer maintain the deformed shape in a condition under the transition temperature. In one example, after the fourth member 170, which is formed of the shape memory polymer to have the initial shape of the pipe-shaped structure with the flange portion, is deformed and inserted into the first hole TH1, a heat treatment is performed to restore the initial shape of the fourth member 170. The fourth member 170 having the restored shape, i.e., the pipe-shaped structure with the flange portion, may cover the portion of the rear surface of the first member 110, the side surface of the adhesive layer 120, the side surface of the polarizing plate 130, the side surface of the display panel 140, the side surface of the second member 150, the portion of the rear surface of the second member 150 and the portion of the side surface of the third member 160. Accordingly, the process of forming or attaching the fourth member 170 can be simplified, and there is an advantage in that the manufacturing cost and process time of the display apparatus 100 can be reduced.

Figure 5:
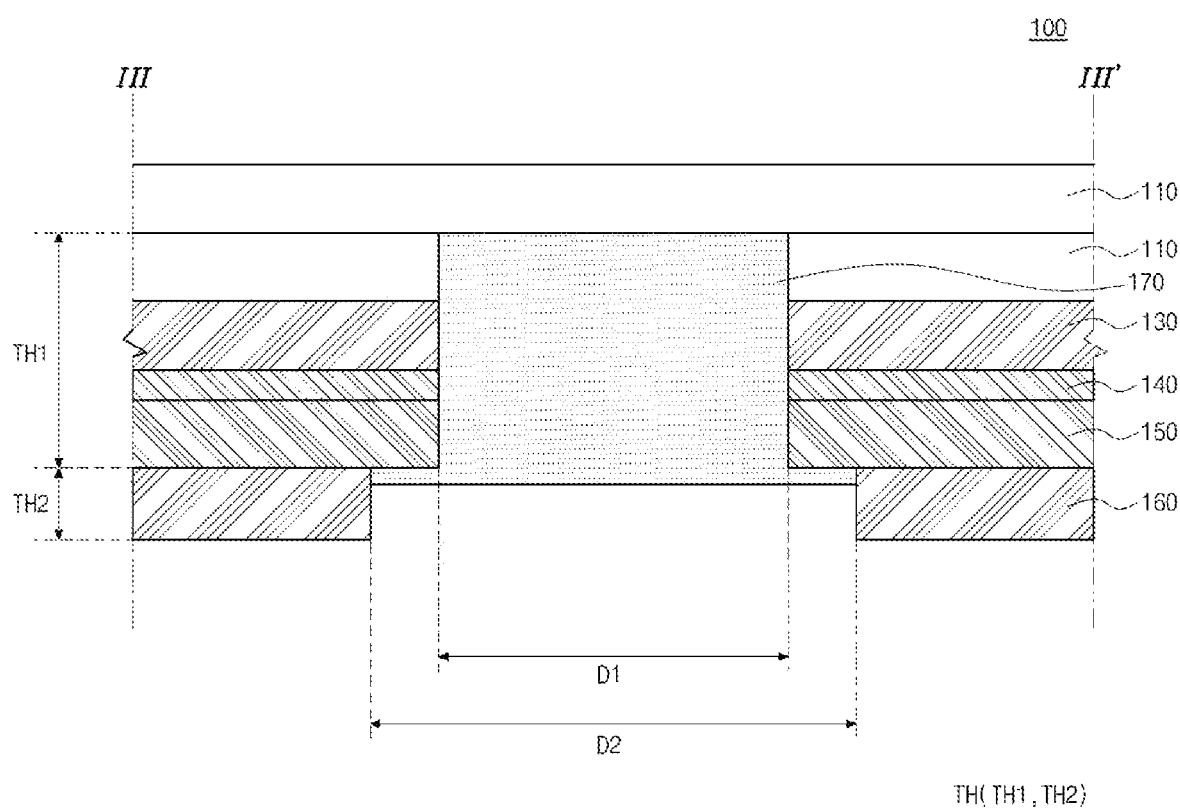
FIG. 5 is a cross-sectional view explaining a process of forming a fourth member in a display apparatus according to an aspect of the present disclosure.

FIG. 5 is a cross-sectional view explaining a process of forming a fourth member in a display apparatus according to an aspect of the present disclosure.

As shown in FIG. 5, the first hole TH1 and a portion of the second hole TH2 is filled with a material for the fourth member 170. The material for the fourth member 170 fills the second hole TH2 to cover the rear surface of the second member 150. Next, a laser trimming into a cylindrical shape having a diameter smaller than the diameter of the first hole TH1 is performed to form the fourth member 170. For example, a cylinder (or cylinder) having a diameter smaller than the diameter of the first hole TH1 and sharing a center with the first hole TH1 is removed by the laser trimming into the material for the fourth member 170 in the through-hole TH so that the fourth member 170 having the pipe-shaped structure with the flange portion can be formed. However, the method of forming the fourth member 170 is not limited thereto, and the trimming is not limited to the laser trimming.

Figure 6:
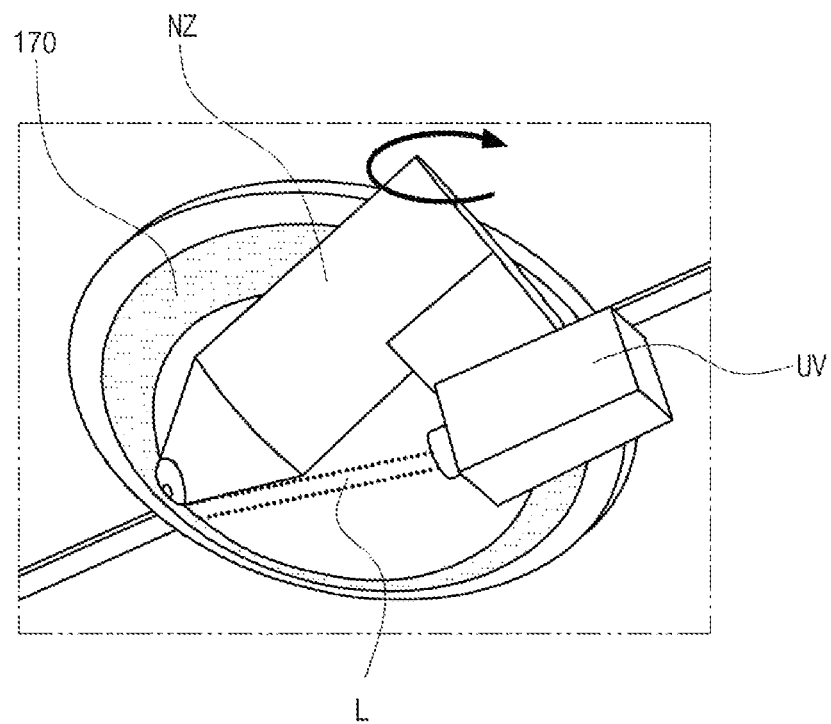
FIG. 6 is a cross-sectional view explaining another process of forming a fourth member in a display apparatus according to an aspect of the present disclosure.

FIG. 6 is a cross-sectional view explaining another process of forming a fourth member in a display apparatus according to an aspect of the present disclosure.

The fourth member 170 may be formed using a process such as pneumatic spray coating or electrostatic spray coating. For example, in the pneumatic spray coating method, the ink material inside the syringe is sprayed through the spray nozzle NZ using air pressure. In the electrostatic spray coating method, a voltage is applied to the ink material to provide an electric charge, and the electrically charge ink material is sprayed through the spray nozzle NZ. For example, the display apparatus 100 is fixed, and the spray nozzle NZ rotates and sprays the ink material inside the through-hole TH. Alternatively, the display apparatus 100 rotates, and the spray nozzle NZ, which is fixed, sprays the ink material inside the through-hole TH. However, aspects of the present disclosure are not limited thereto.

When the fourth member 170 is formed by the pneumatic spray coating or the electrostatic spray coating, the viscosity of the ink material for the fourth member 170 may be about 10,000 cPs or less, and the method and properties are not limited thereto. If the viscosity of the fourth member 170 is lower than the above value, the coated ink material may flow by gravity or inertia so that the coated ink material may be changed into an unintended shape. For example, the ink material coated on a portion of a rear surface of the first member 110, a side surface of the adhesive layer 120, a side surface of the polarizing plate 130, a side surface of the display panel 140, a side surface of the second member 150, a portion of a rear surface of the second member 150 and a portion of side surface of the third member 160 may flow so that at least one of them may be exposed.

With reference to FIG. 6, the spray nozzle NZ rotates and spray the ink material inside the through-hole TH of the fixed display apparatus 100 to form the fourth member 170. Alternatively, the fixed spray nozzle NZ sprays the ink material inside the through-hole TH of the rotated display apparatus 100 to form the fourth member 170. However, aspects of the present disclosure are not limited thereto. When the fourth member 170 is formed by the ink material spraying method, an ultraviolet irradiator UV may be disposed on one side of the nozzle NZ. When the ink material is sprayed from the nozzle NZ and applied to the inside of the through-hole TH, the ultraviolet irradiator UV disposed on one side of the nozzle NZ irradiates the ultraviolet ray L to cure and solidify the applied ink material. For example, when the nozzle NZ rotates clockwise to spray the ink material and apply the ink material to the inside of the through-hole TH, the ultraviolet irradiator UV is disposed on the left side of the nozzle NZ to apply the ultraviolet ray L. As a result, the applied ink material can be immediately cured and solidified. Accordingly, the ink material applied to the inside of the through-hole TH may be solidified without flowing to form the fourth member 170.

In the display apparatus 100 according to the aspect of the present disclosure, the fourth member 170 is formed inside the through-hole TH, where the optical component is disposed, so that the light leakage from the sub-pixels to the optical component from can be prevented. For example, the fourth member 170 may be disposed to cover the inner surface of the through-hole TH, and may block light emitted from the plurality of sub-pixels SP from being directed into the through-hole TH. When the light from the plurality of sub-pixels SP is transmitted to the inside of the through-hole TH, recognition of external light of the optical component may be interfered so that the reliability of the optical component may be deteriorated. For example, the light from the plurality of sub-pixels SP may act as a noise. In the display apparatus 100 according to the aspect of the present disclosure, by disposing the fourth member 170 inside the through-hole TH, the light leakage may be prevented and reliability of the optical component may be improved.

The display apparatus 100 according to the aspect of the present disclosure may use the fourth member 170 to discharge the static electricity generated in the first member 110. The first member 110 is exposed to the outside of the display apparatus 100, and the static electricity may be easily generated by friction with the outside. For example, when the static electricity generated from the first member 110 flows into the display panel 140, the structure inside the display panel 140 may be damaged and may lead to a defect in the display apparatus 100. In this case, the fourth member 170 may be made of a material having the electrical conductivity, so that the static electricity generated in the first member 110 may be discharged to the third member 160. The third member 160 is electrically grounded and configured to discharge the static electricity. The fourth member 170 may be disposed to connect the third member 160 and the first member 110 to form a path for discharging the static electricity generated from the first member 110. Accordingly, the static electricity of the first member 110 may be discharged and the introduction of the static electricity into the display panel 140 may be minimized.

In the display apparatus 100 according to the aspect of the present disclosure, the process may be simplified and manufacturing costs may be reduced by using the fourth member 170 having integrated functions of preventing light leakage and electrostatic discharge. For example, a process of forming a light blocking ink to prevent light leakage in the through-hole TH and a process of attaching a conductive tape to the inside of the display device for electrostatic discharge may be separately performed. However, in the display apparatus 100 according to the aspect of the present disclosure, the fourth member 170 for preventing light leakage through the through hole TH has conductivity to have the electrostatic discharge function. Thereby, the process of attaching a conductive tape can be eliminated, and manufacturing cost can be reduced.

In the display apparatus 100 according to the aspect of the present disclosure, the fourth member 170 having integrated functions of preventing light leakage and electrostatic discharge may be formed of a shape memory material that expands by heat treatment. The fourth member 170 in the shape of a pipe having a flange portion is formed with a shape memory material and contracted, and the fourth member 170 is expanded and attached inside the through-hole TH by heat treatment. Accordingly, the manufacturing time and cost can be reduced. In addition, the manufacturing process can be simplified.

The display apparatus according to an aspect of the present disclosure will be described as follows.

A display apparatus according to the present disclosure comprises a display panel including a display area, in which a plurality of sub-pixels are disposed, and a sensor area at the display area, a first hole disposed at the sensor area; a first member disposed on a front surface of the display panel; a second member disposed at a rear surface of the display panel and including the first hole; a third member disposed at a rear surface of the second member and including a second hole overlapping the first hole; and a fourth member covering an inner surface of the first hole and a portion of the second member exposed through the second hole.

According to some aspect of the present disclosure, an end of the fourth member may contact a portion of an inner surface of the second hole.

According to some aspect of the present disclosure, the display device may further comprise an adhesive layer between the display panel and the first member; and a polarizing plate between the adhesive layer and the display panel, wherein the first hole is disposed along the adhesive layer, the polarizing plate, the display panel and the second member.

According to some aspect of the present disclosure, a diameter of the first hole may be smaller than a diameter of the second hole, wherein the fourth member covers a side surface of each of the adhesive layer, the polarizing plate, the display panel and the second member exposed in the first hole, and wherein the fourth member covers a rear surface of the second member and a portion of a side surface of the third member exposed in the second hole.

According to some aspect of the present disclosure, a diameter of the first hole and a diameter of the second hole may be same, and wherein the fourth member covers at least one of a side surface of the adhesive layer, a side surface of the polarizing plate, a side surface of the display panel, a side surface of the second member and a side surface of the third member exposed in at least one of the first and second holes.

According to some aspect of the present disclosure, the sensor area may be disposed between the plurality of sub-pixels in the display area, and wherein a light from the plurality of sub-pixel toward the first hole is blocked by the fourth member.

According to some aspect of the present disclosure, a static electricity of the first member may be discharged to the third member through the fourth member.

According to some aspect of the present disclosure, the fourth member may be formed of a conductive material.

According to some aspect of the present disclosure, the fourth member may be formed of a moisture-proof material.

According to some aspect of the present disclosure, the fourth member may have a pipe shape having a flange portion.

According to some aspect of the present disclosure, the fourth member may have a shape memory property expanding by a heat treatment.

According to some aspect of the present disclosure, the fourth member may be formed by trimming a material filling the first hole and covering a rear surface of the second member, which is exposed by the second hole, by a cylinder shape having a diameter smaller than a diameter of the first hole.

According to some aspect of the present disclosure, the fourth member may be formed by coating an ink on an inner side surface of the first hole and a rear surface of the second member, which is exposed by the second hole, and irradiating a laser onto the coated ink.

According to some aspect of the present disclosure, the ink may have a conductive property.

It will be apparent to those skilled in the art that various modifications and variations can be made in the aspects of the present disclosure without departing from the technical idea or scope of the present disclosure. Thus, it is intended that the modifications and variations cover this disclosure provided they come within the scope of the appended claims and their equivalents.

What is claimed is:

1. A display apparatus, comprising:
    a display panel including a display area in which a plurality of sub-pixels are disposed, and a sensor area disposed at the display area and having a first hole;
    a first member disposed on a front surface of the display panel;
    an adhesive layer disposed between the display panel and the first member;
    a second member disposed at a rear surface of the display panel and including the first hole;
    a third member disposed at a rear surface of the second member and including a second hole overlapping with the first hole; and
    a fourth member covering an inner surface of the first hole and a portion of the second member exposed through the second hole,
    wherein the fourth member is extended to a lower surface of the first member to that the first member is directly contacted to a corner between the first member and the adhesive layer to cover a boundary area of the first member and the adhesive layer.

2. The display apparatus according to claim 1, wherein an end of the fourth member contacts a portion of an inner surface of the second hole.

3. The display apparatus according to claim 1, further comprising:
    a polarizing plate disposed between the adhesive layer and the display panel, and
    wherein the first hole is disposed along the adhesive layer, the polarizing plate, the display panel, and the second member.

4. The display apparatus according to claim 3, wherein a diameter of the first hole is smaller than a diameter of the second hole,
    wherein the fourth member covers a side surface of each of the adhesive layer, the polarizing plate, the display panel and the second member exposed in the first hole, and
    wherein the fourth member covers a rear surface of the second member and a portion of a side surface of the third member exposed in the second hole.

5. The display apparatus according to claim 3, wherein a diameter of the first hole and a diameter of the second hole are the same, and
    wherein the fourth member covers at least one of a side surface of the adhesive layer, a side surface of the polarizing plate, a side surface of the display panel, a side surface of the second member and a side surface of the third member exposed in at least one of the first and second holes.

6. The display apparatus according to claim 1, wherein the sensor area is disposed between the plurality of sub-pixels in the display area, and
    wherein light from the plurality of sub-pixel toward the first hole is blocked by the fourth member.

7. The display apparatus according to claim 1, wherein a static electricity of the first member is discharged to the third member through the fourth member.

8. The display apparatus according to claim 1, wherein the fourth member is formed of a conductive material.

9. The display apparatus according to claim 8, wherein the fourth member is formed of a moisture-proof material.

10. The display apparatus according to claim 1, wherein the fourth member has a pipe shape having a flange portion.

11. The display apparatus according to claim 1, wherein the fourth member has a shape memory property expandable by a heat treatment.

12. The display apparatus according to claim 1, wherein the fourth member is formed by trimming a material filling the first hole and covering a rear surface of the second member, which is exposed by the second hole, by a cylinder shape having a diameter smaller than a diameter of the first hole.

13. The display apparatus according to claim 1, wherein the fourth member is formed by coating an ink on an inner side surface of the first hole and a rear surface of the second member, which is exposed by the second hole, and irradiating a laser onto the coated ink.

14. The display apparatus according to claim 13, wherein the ink has a conductive property.

* * * * *